United States Patent
Hurkx et al.

(10) Patent No.: US 6,930,011 B2
(45) Date of Patent: Aug. 16, 2005

(54) SEMICONDUCTOR DEVICE WITH A BIPOLAR TRANSISTOR, AND METHOD OF MANUFACTURING SUCH A DEVICE

(75) Inventors: Godefridus A. M. Hurkx, Eindhoven (NL); Holger Schligtenhorst, Eindhoven (NL); Bernd Sievers, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 5 days.

(21) Appl. No.: 09/854,403

(22) Filed: May 11, 2001

(65) Prior Publication Data

US 2002/0024113 A1 Feb. 28, 2002

Related U.S. Application Data

(62) Division of application No. 09/247,782, filed on Feb. 9, 1999, now Pat. No. 6,252,282.

(30) Foreign Application Priority Data

Feb. 9, 1998 (EP) .............................................. 98200394

(51) Int. Cl.⁷ ............................................ H01L 21/331
(52) U.S. Cl. ....................... 438/350; 438/235; 438/349; 257/592
(58) Field of Search ................................ 438/235, 350, 438/349, 167, 169, 170, 173, 174, 181, 194, 202, 224, 233, 234, 282, 305, 306, 309, 331, 332, 338, 369, 372, 373, 374, 376, 570, 313, FOR 165, FOR 166; 257/592, 526, 560, 565, E29.044, E29.144

(56) References Cited

U.S. PATENT DOCUMENTS

| 4,345,265 A | * | 8/1982 | Blanchard ..................... 257/339 |
| 4,735,912 A | * | 4/1988 | Kawakatsu ................... 438/362 |
| 4,742,380 A | * | 5/1988 | Chang et al. ................. 257/125 |
| 4,805,004 A | * | 2/1989 | Gandolfi et al. .............. 257/496 |
| 4,860,072 A | * | 8/1989 | Zommer ....................... 257/144 |
| 4,969,027 A | * | 11/1990 | Baliga et al. ................. 257/130 |
| 5,132,235 A | * | 7/1992 | Williams et al. ............. 438/294 |
| 5,218,228 A | * | 6/1993 | Williams et al. ............. 257/593 |
| 5,536,958 A | * | 7/1996 | Shen et al. .................. 257/356 |

* cited by examiner

Primary Examiner—George Fourson
Assistant Examiner—Julio J. Maldonado
(74) Attorney, Agent, or Firm—Peter Zawilski

(57) ABSTRACT

A semiconductor device includes a preferably discrete bipolar transistor with a collector region, a base region, and an emitter region which are provided with connection conductors. A known means of preventing a saturation of the transistor is that the latter is provided with a Schottky clamping diode. The latter is formed in that case in that the connection conductor of the base region is also put into contact with the collector region. Here, the second connection conductor is exclusively connected to the base region, and a partial region of that portion of the base region which lies outside the emitter region, as seen in projection, lying below the second connection conductor is given a smaller flux of dopant atoms. The bipolar transistor is provided with a pn clamping diode which is formed between the partial region and the collector region.

8 Claims, 2 Drawing Sheets

Figure 1:
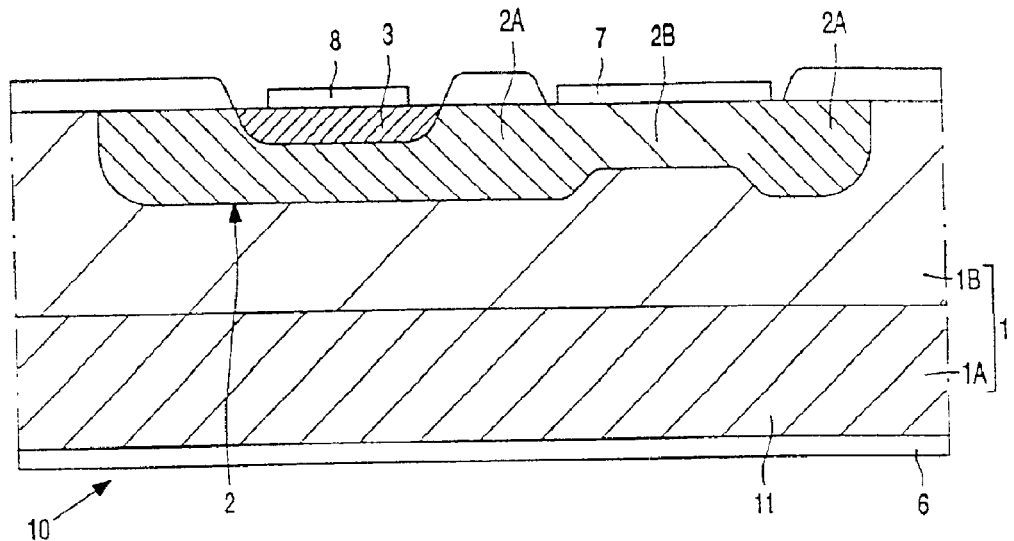

SEMICONDUCTOR DEVICE WITH A BIPOLAR TRANSISTOR, AND METHOD OF MANUFACTURING SUCH A DEVICE

This is a divisional of application Ser. No. 09/247,782 filed Feb. 9, 1999 now U.S. Pat. No. 6,252,282.

TECHNICAL FIELD

The invention relates to a semiconductor device with a semiconductor body comprising a substrate and a first semiconductor region which lies in the semiconductor body, which is of a first conductivity type, which forms a collector region of a bipolar transistor, which is provided with a first connection conductor, and above which a second semiconductor region of a second conductivity type opposed to the first is present, forming a base region of the transistor, adjoining the surface of the semiconductor body, and being provided at said surface with a second connection conductor, and a third semiconductor region which lies recessed in the second semiconductor region, which is of the first conductivity type, which forms an emitter region of the transistor, and which is provided with a third connection conductor, said device being provided with means for limiting the degree of saturation of the transistor during normal use. The invention also relates to a method of manufacturing such a device.

BACKGROUND AND SUMMARY OF THE INVENTION

Such a device with a bipolar transistor is frequently used as a switching transistor, for example in a static power conversion circuit. The switching speed of the transistor, which is usually a discrete component, should often be as high as possible.

Such a device and method are known from U.S. Pat. No. 4,969,027 published on Nov. 6, 1990. A bipolar transistor is disclosed therein (see FIG. 1B) which is provided with means for limiting the saturation. Said means comprise a Schottky clamping diode integrated into the device and formed in that the connection conductor of the base region is also put into contact with the collector region. Since the Schottky diode limits the degree of saturation, the switching time of the transistor is as short as possible, while on the other hand the latter does not get very far removed from the saturated state, which implies that a high collector-emitter voltage and high losses in the on-state are avoided.

A disadvantage of the known device is that it is less suitable for mass manufacture. Such a manufacture renders it important that the properties of the device within a batch and among batches do not vary too widely. The leakage current of a Schottky diode, however, is often too variable, in particular at higher temperatures. This is because the surface of the semiconductor body has a major influence on said leakage current, and because the properties of a surface are often difficult to control. A further influence here is the occurrence of so-called spikes, i.e. locations where the metal of the connection conductor of the base region penetrates into the collector region.

It is an object of the present invention to provide a device which does not have the above disadvantage and which comprises a bipolar transistor which is provided with means for reducing the degree of saturation, which is suitable for mass manufacture, and which has excellent properties as regards the leakage current.

According to the invention, a device of the kind mentioned in the opening paragraph is for this purpose characterized in that the second connection conductor is exclusively connected to the second semiconductor region for the purpose of preventing saturation of the transistor, and in that a partial region of that portion of the second semiconductor region which lies outside the third semiconductor region, as seen in projection, and which lies adjacent the second connection conductor comprises a smaller flux of dopant atoms. The invention is based on the recognition that the region where the doping flux has been reduced in such a device acts as a base diode which is connected in parallel to the collector-base junction of the transistor. When the transistor is in the saturated state—i.e. both the base-emitter and the base-collector junction are forward biased—the saturation collector current is mainly defined by the base-emitter voltage, and the saturation base current by the base-collector voltage. Since the base diode also passes part of the current through the base connection conductor, the base current is reduced. This reduces the base-collector voltage, with the result that the quantity of charge stored in the collector, i.e. in the weakly doped portion of the collector, is reduced. This reduces the switching time of the transistor. A further result of the above is that the saturation collector-emitter voltage rises because the collector-base voltage becomes less negative. An exchange takes place as it were between switching time and saturation collector-emitter voltage. The degree of saturation in a device according to the invention is limited by the base diode. The operation of the partial region having a reduced doping flux may be explained as follows: the current through the base diode is proportional to the gradient in the electron concentration of the base connection to the base-collector junction of the base diode. This gradient can be increased in that the thickness of the relevant partial region of the base is made smaller (the denominator of the gradient becomes smaller), or in that the doping concentration (p) is made smaller, so that—given a constant pn product—the electron concentration (n) at the junction becomes higher (the numerator of the gradient becomes greater), or by a combination of both measures. It is assumed in the above that the electron concentration adjacent the second connection conductor is zero, or at least very small, because of the very high recombination rate prevailing there. In all cases, accordingly, the desired behaviour of the device according to the invention is realized through the formation of a base diode which arises owing to a local reduction in the flux of dopant atoms in the base region of the transistor. This base diode may be regraded as a pn clamping diode. It does not have the disadvantages of a Schottky clamping diode mentioned above as used in the known device. As a result, a device according to the invention has a narrow spread and a good reproducibility as regards its leakage current. The characteristic formulated above, moreover, implies that the properties of the partial region of the second semiconductor region should be formed separately. This renders it possible to adapt the properties of the pn clamping diode, if so desired. This again leads to the possibility inter alia of obtaining a combination of the switching time $t_s$ and another important transistor characteristic, i.e. $V_{CEsat}$ (the collector-emitter voltage in the on-state) suitable for a given application.

In a first embodiment of a device according to the invention, the local reduction in the flux of dopant atoms is realized in that the doping concentration of the second semiconductor region is locally reduced. In a second embodiment, this is realized by means of a localized small thickness of the second semiconductor region. Preferably, both measures are taken at the same time. The flux of dopant atoms in the partial region of the second semiconductor region should be great enough in all cases for preventing punch-through. This is to say, it should be great enough to prevent the depletion layer of the base diode from reaching the second connection conductor at the maximum admissible reverse voltage. The leakage current of the pn clamping diode could otherwise become variable and high in that case, as in a Schottky clamping diode. In practice, very wide possibilities remain for making both the thickness and the doping concentration of the partial region substantially smaller than in the remainder of the portion of the second semiconductor region which lies outside the third semiconductor region. It is necessary for a good operation of the pn clamping diode that the latter should be in the vicinity of, and preferably below the second connection conductor.

In another very favourable embodiment of a device according to the invention, a fourth semiconductor region of the first conductivity type is present between the partial region of the second semiconductor region and the second connection conductor, which fourth semiconductor region has a small thickness and a high doping concentration, preferably the same thickness and doping concentration as the third semiconductor region. The device is then as it were provided with a special version of a clamping transistor. Its effectivity as a means of limiting the degree of saturation then also depends on the remaining portion of the partial region of the second semiconductor region which has a reduced flux of dopant atoms. The adjustment of the thickness of the semiconductor region thus provides an additional degree of freedom for the adjustment of the effectivity of the saturation limitation. The doping concentration of the fourth semiconductor region has substantially no influence on said effectivity. If the fourth semiconductor region has the same thickness and doping concentration as the third semiconductor region, the important additional advantage is obtained that the fourth semiconductor region can be provided simultaneously with the third semiconductor region, which keeps the manufacture simple. The presence of the fourth semiconductor region also provides a further protection for the device, in particular the clamping device, against the influence of the spikes mentioned earlier.

A method of manufacturing a semiconductor device whereby a first semiconductor region is formed in a semiconductor body comprising a substrate, which first semiconductor region lies in the semiconductor body, is of a first conductivity type, forms a collector region of a bipolar transistor, and is provided with a first connection conductor, whereby a second semiconductor region of a second conductivity type opposed to the first is formed above said first semiconductor region, which second semiconductor region forms a base region of the transistor, adjoins the surface of the semiconductor body, and is provided with a second connection conductor at said surface, whereby a third semiconductor region is formed which is recessed into the second semiconductor region, which is of the first conductivity type, which forms an emitter region of the transistor, and which is provided with a third connection conductor, and whereby the device is provided with means for preventing a saturation of the transistor during normal use, is characterized according to the invention in that the second connection conductor is exclusively connected to the second semiconductor region for the purpose of preventing a saturation of the transistor, and in that a partial region of that portion of the second semiconductor region which lies outside the third semiconductor region, as seen in projection, and adjacent the second connection conductor is provided with a smaller flux of dopant atoms. A device according to the invention is obtained by such a method.

In a preferred embodiment, the partial region of the second semiconductor region is formed below the second connection conductor and is given a smaller thickness and a lower doping concentration. Preferably, the partial region of the second semiconductor region is formed by means of ion implantation. This renders it possible to adjust the properties of the partial region in an accurate and reproducible manner.

In a favourable modification, a thin fourth semiconductor region of the first conductivity type is formed between the partial region of the second semiconductor region and the second connection conductor, preferably simultaneously with the third semiconductor region. A device according to the invention is thus obtained in a simple manner, comprising a special modification of a clamping transistor as described above.

The invention will now be explained in more detail with reference to two embodiments and the accompanying drawing, in which

BRIEF DESCRIPTION OF THE DRAWING FIGURES

Figure 2:
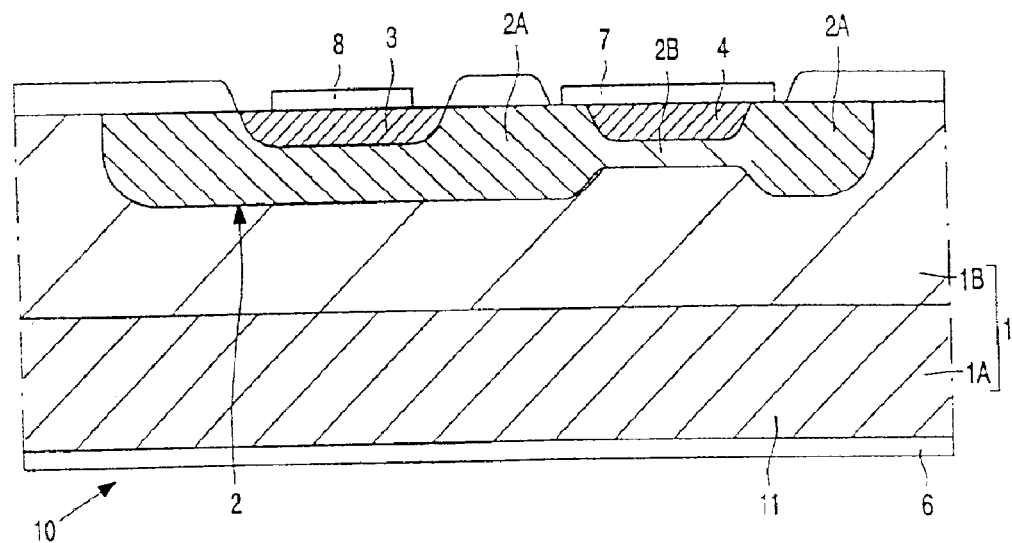
Figure 3:
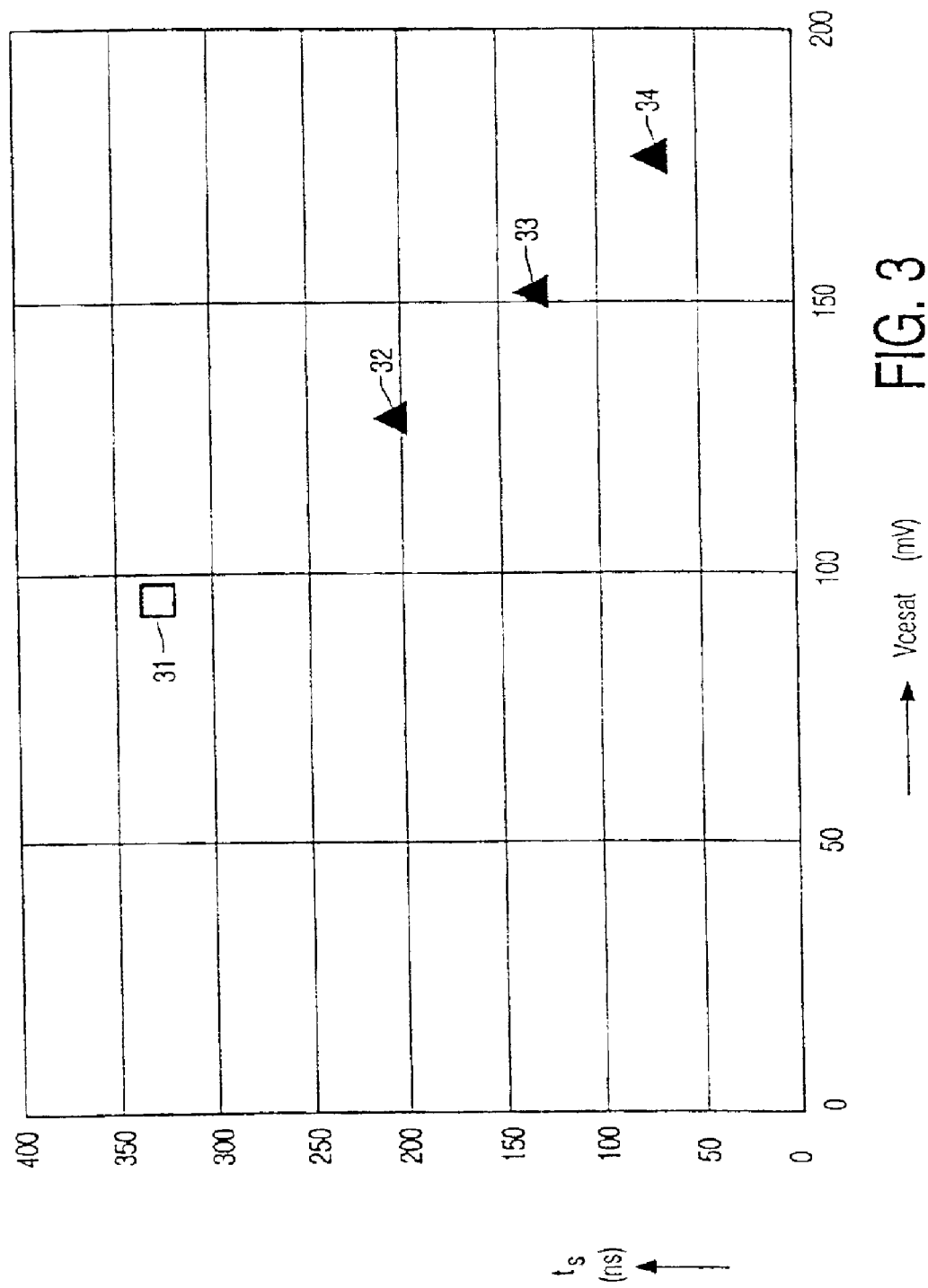

FIG. 1 shows a first embodiment of a device according to the invention diagrammatically and in a cross-section taken perpendicularly to the thickness direction, FIG. 2 shows a second embodiment of a device according to the invention diagrammatically and in a cross-section taken perpendicularly to the thickness direction, and FIG. 3 shows the switching time ($t_s$) as a function of the saturation collector-emitter voltage ($V_{CEsat}$) for a device with a bipolar transistor and for the device of FIG. 1.

DETAILED DESCRIPTION

The Figures are diagrammatic and not drawn true to scale, the dimensions in the thickness direction being particularly exaggerated for greater clarity. Semiconductor regions of the same conductivity type are hatched in the same direction as a rule.

FIG. 1 shows a first embodiment of a device comprising a transistor and a pn clamping diode according to the invention in a diagrammatic cross-section taken perpendicularly to the thickness direction. The device comprises a semiconductor body 10 of silicon with a substrate 1A which is doped with antimony $n^{++}$ here, whose resistivity is 6–20 mΩcm, and which forms part of a first semiconductor region 1 which forms a collector region 1 of a bipolar transistor. An epitaxial layer 1B of the n-conductivity type present on the substrate 1A forms the remaining portion 1B of the collector region 1. The layer 1B is 10 μm thick and has a doping concentration of $10^{15}$ at/cm$^3$. The collector region 1 is provided with a first connection conductor 6 which is present at the lower side of the substrate 1A. A 2 μm thick second semiconductor region 2 of a second conductivity type opposed to the first, i.e. the p-type here, is present in the epitaxial layer 1B, has a doping concentration of $10^{17}$ at/cm$^3$, is recessed into the surface of the semiconductor body 10, and is provided with a second connection conductor 7. A third semiconductor region 3 of the first conductivity type, i.e. the n-type here, forming an emitter region 3 of the transistor and provided with a third connection conductor 8, is present in the second semiconductor region 2, which forms a base region 2 of the transistor, said third semiconductor region 3 being recessed as seen from the surface.

According to the invention, the second connection conductor 7 is exclusively connected to the base region 2 and accordingly does not form a Schottky junction with the portion of the collector region 1 adjoining the surface, this in contrast to the known device. The problems inherent in such a Schottky junction, such as a high, strongly variable and not well reproducible leakage current, thus do not arise in a device according to the invention. According to the invention, furthermore, a partial region 2B of the portion 2A of the second semiconductor region 2 lying outside the third semiconductor region 3, as seen in projection, is provided with a smaller flux of dopant atoms. This partial region 2B together with the subjacent portion of the collector region 1 forms a base diode which acts as a pn clamping diode in the device according to the invention. This diode limits a saturation of the transistor without the disadvantages of the known clamping diode. The reduced quantity of charge carriers in the partial region 2B has a favourable influence on the switching time ($t_s$) of the transistor.

The reduced flux of dopant atoms may be realized in that the second semiconductor region 2 is locally, i.e. below the second connection conductor 7, provided with a smaller thickness or a lower doping concentration. In the present example, the partial region 2B has a smaller thickness as well as a lower doping concentration than the remaining portion 2A of the second semiconductor region 2 lying outside the third semiconductor region 3. The partial region 2B is preferably at least as thin as down to half the thickness of the remainder 2A of the second semiconductor region, for example, 1 $\mu$m in the present example. The doping concentration of the partial region 2B is preferably at least 5 to 10 times lower than in the remainder 2A of the second semiconductor region 2, for example, approximately $10^{16}$ at/cm$^3$ here. Said thicknesses and doping concentrations are such that the depletion layer belonging to the base-collector junction does not reach the second connection conductor 2 in this embodiment of the transistor in which the maximum voltage across said base-collector junction is 60 V during operation. In the opposite case, the leakage current in the device would increase, which is undesirable.

The embodiment of the device described here has a rectangular geometry. The dimensions of the semiconductor body are approximately 300×500 $\mu$m$^2$, and its thickness is 300 $\mu$m. In addition, a so-called channel stopper (not shown in the Figure) is present in the first semiconductor region 1. The second semiconductor region 2 measures approximately 150×150 $\mu$m$^2$. The third semiconductor region 3 measures approximately 20×20 $\mu$m$^2$. The partial region 2B is approximately 20×300 $\mu$m$^2$, which is a little smaller than the dimensions of the second connection conductor 7, and lies at a distance of approximately 10 $\mu$m from the third semiconductor region 3. The transistor in this example is highly suitable for use as a switching transistor in an automotive system.

FIG. 3 shows the switching time ($t_s$) as a function of the saturation collector-emitter voltage ($V_{CEsat}$) for a device having a bipolar transistor and for the device of FIG. 1. The square 31 corresponds to a bipolar transistor which differs from the device of FIG. 1 in that the base region 2 has the same thickness and doping concentration everywhere. The triangles 32, 33, 34 correspond to different modifications of the device of FIG. 1, i.e. a device according to the invention. The positions of said triangles 32, 33, 34 clearly show that the saturation remains limited in a device according to the invention, which results in a device having a comparatively high switching speed and a comparatively low, at least acceptably low $V_{CEsat}$. All devices shown in this Figure have a low, non-variable, and well reproducible leakage current owing to the absence of a Schottky junction.

The device in accordance with this example is manufactured by a method according to the invention, for example, as follows. First an epitaxial n-type silicon layer 1B is provided on an n-type silicon substrate 1A. The surface of the semiconductor body 10 is then oxidized and a rectangular opening corresponding to the base region 2 of the transistor to be formed is provided therein by means of photolithography and etching, such that the oxide formed remains intact at the area of the partial region 2B of the base region. The oxide formed acts as a mask for a boron ion implantation with a flux of $10^{14}$ at/cm$^2$ at an implantation energy of 80 keV. Then the oxide is removed above the partial region 2B by means of photolithography and etching, and the partial region 2B is formed by means of a boron ion implantation, with the provided photoresist acting as a mask. The flux and energy for this implantation are $10^{13}$ at/cm$^2$ and 40 keV, respectively. The thickness and doping concentration of the partial region 2B then become as indicated above. After any remnants of the photoresist layer have been removed, the semiconductor body 10 is annealed during 30 minutes at a temperature of 950° C. This is followed by an oxidation step and the formation of the third semiconductor region 3 through diffusion of phosphorus atoms from a so-called phosphorus glass through an opening formed in the oxide at the area of the third semiconductor region 3. The thicknesses, doping concentrations, dimensions, and the like not mentioned here are chosen as indicated above in the discussion of FIG. 1. Connection conductors 6, 7, 8 connected to the various semiconductor regions 1, 2, 3 are formed in a usual manner for the electrical connection thereof, for example through vapour deposition of an aluminum layer which is subsequently patterned as desired. The eventual device suitable for final mounting and/or enveloping is then formed by sawing in two mutually perpendicular directions.

FIG. 2 shows a second embodiment of a device according to the invention in a cross-section taken perpendicularly to the thickness direction. The device in this example is largely identical to that in the first example. The difference lies in the presence of a fourth semiconductor region 4 of the second conductivity type, i.e. the p-type, which is present in the partial region 2B and which makes contact with the second connection conductor 7. The second partial region 2B as a result is even thinner here than it is in the first embodiment, which benefits the effectivity. The bipolar transistor of the device in this example is as it were provided with a special clamping transistor which is present between the first connection conductor 6 and the second connection conductor 7. Preferably, as in the present example, the fourth semiconductor region 4 has the same doping concentration and thickness as the third semiconductor region 3. This has the advantage that the fourth semiconductor region 4 can be formed simultaneously with the third semiconductor region 3, so that the manufacture of the device according to this example need not differ substantially from that of the first embodiment of the device: the mask necessary for forming the third semiconductor region need only be provided with an additional opening at the area of the partial region 2B. A further advantage of the presence of the fourth semiconductor region 4 is that it acts as an additional protection against undesirable interactions between the second connection conductor 7 and the partial region 2B, and between the second connection conductor and the pn junction between the fourth semiconductor region 4 and the partial region 2B.

The invention is not limited to the embodiments given, many modifications and variations being possible to those skilled in the art within the scope of the invention. Thus compositions and thicknesses may be chosen for the various (semiconductor) regions or layers other than those mentioned in the examples. It is also possible to use alternative deposition techniques instead of those mentioned, such as MBE (=Molecular Beam Epitaxy) and CVD (=Chemical Vapor Deposition). The manufacture may also be modified in various ways. Thus the implantation of the partial region of the base region may be carried out at various points in the manufacturing process. If so desired, the mask used for the formation of the connection conductors lying on the surface may be used for implanting the partial region, which renders an extra mask unnecessary.

The geometries of the regions may be differently chosen, if so desired. Thus the emitter region, but also the partial region of the base region, may have a comb shape for promoting a high admissible power.

A device according to the invention may also be a more complicated device than a single bipolar transistor. The device may comprise a number of other active or passive electronic components, so that circuit may be integrated into the otherwise essentially discrete component.

What is claimed is:

1. A method of manufacturing a semiconductor device which comprises a first semiconductor region of a first conductivity type with a first connection conductor forming a collector region of a bipolar transistor, a second semiconductor region of a second conductivity type opposed to the first conductivity type with a second connection conductor forming a base region of the transistor, and a third semiconductor region of the first conductivity type with a third connection conductor forming an emitter region of the transistor; said method comprising:

forming the first semiconductor region of the first conductivity type;

forming the second semiconductor region on the first semiconductor region, the second semiconductor region having a partial region with a smaller flux of dopant atoms than another part of the second semiconductor region;

forming the third semiconductor region which lies recessed in the other part, and outside the partial region, of the second semiconductor region; and providing first, second and third connection conductors to the first, second and third regions wit a connection conductor respectively, wherein the second conductor is exclusively connected to the second semiconductor region and adjoins the partial region of he second semiconductor region.

2. A method as claimed in claim 1, characterized in that the partial region of the second semiconductor region is formed below the second connection conductor and is given a smaller thickness and a lower doping concentration than those in the other region.

3. A method as claimed in claim 1, characterized in that the partial region of the second semiconductor region is given a smaller thickness than that in the other region.

4. A method as claimed in claim 1, characterized in that the partial region of the second semiconductor region is formed by means of ion implantation.

5. The method of claim 1, wherein the second semiconductor region is above the first semiconductor region and wherein the first connection conductor adjoins a bottom side of the first region opposing the second semiconductor region.

6. The method of claim 1, wherein forming the second semiconductor region includes forming the partial region of the second semiconductor region having a doping concentration at least five to ten times lower than the doping concentration of the other part of the second semiconductor region.

7. The method of claim 1, wherein forming the second semiconductor region includes forming the partial region of the second semiconductor region having a thickness at least as thin as half the thickness of the other part of the second semiconductor region.

8. The method of claim 1, further including forming a fourth semiconductor region of the second conductivity type in the partial region of the second semiconductor region wherein the fourth semiconductor region makes contact with the second connection conductor.

* * * * *